United States Patent [19]

Nayebi et al.

[11] Patent Number: 5,760,635
[45] Date of Patent: Jun. 2, 1998

[54] APPARATUS FOR SWITCHING CHANNELS WITHIN A MULTI-CHANNEL READ/WRITE PREAMPLIFIER CIRCUIT

[75] Inventors: Mehrdad Nayebi, Palo Alto; Mahmud Musbah, Santa Clara, both of Calif.; Norio Shuji, Yokohama, Japan

[73] Assignees: Sony Corporation, Tokyo, Japan; Sony Electronics, Inc., Park Ridge, N.J.

[21] Appl. No.: 622,558

[22] Filed: Mar. 25, 1996

[51] Int. Cl.$^6$ ...................................... H03K 17/62
[52] U.S. Cl. ................ 327/403; 327/407; 327/411
[58] Field of Search .................. 327/99, 310, 355, 327/379, 384, 403, 404, 405, 407, 408, 411; 360/55, 61, 63

[56] References Cited

U.S. PATENT DOCUMENTS 4,905,238  2/1990  Rinaldis ........................... 327/411

*Primary Examiner*—Timothy P. Callahan
*Assistant Examiner*—Jeffrey Zweizig
*Attorney, Agent, or Firm*—Haverstock & Owens LLP

[57] ABSTRACT

A switching apparatus for switching between channels within a read/write pre-amplifier circuit in a multi-channel magnetic media storage system switches between the channels and couples an active magnetoresistive sensor to receive biasing current and to a pre-amplifier circuit. When a read operation is requested from a specific channel within the magnetic media storage system, a control signal line corresponding to an appropriate magnetoresistive sensor is activated. Each channel includes a first corresponding transistor which is enabled by an appropriate control signal line, allowing current to flow through the first transistor to enable a second corresponding transistor that is coupled to the magnetoresistive sensor. Once enabled the second transistor couples the magnetoresistive sensor to a pre-amplifier stage and to receive biasing current. The magnetoresistive sensor then transmits pulses, corresponding to the data being read from the magnetic medium, which are amplified by the pre-amplifier stage and provided as an output to a read channel. Multiple channels are supported, each including a magnetoresistive sensor and first and second corresponding transistors. A control logic circuit provides the control signal lines, one for each channel. A single compensation capacitor is included.

20 Claims, 3 Drawing Sheets

APPARATUS FOR SWITCHING CHANNELS WITHIN A MULTI-CHANNEL READ/WRITE PREAMPLIFIER CIRCUIT

FIELD OF THE INVENTION

The present invention relates to the field of amplifiers within magnetic storage systems using magnetoresistive sensors. In particular, the present invention relates to the field of switching between multiple channels within a magnetic storage system in order to amplify the signal from the selected channel.

BACKGROUND OF THE INVENTION

To read recorded data from a magnetic media storage system, a read/write head including a magnetoresistive sensor is passed over a magnetic medium and transduces the magnetic transitions into pulses of an analog signal that alternates in polarity. This analog signal is then amplified by a pre-amplifier stage within the magnetic media storage system and provided to and decoded by read channel circuitry, included in a circuit that is generally mounted on a motherboard within the host system, to reproduce the digital data.

The pre-amplifier circuit is generally included within a read/write chip coupled inside the storage media system. Typically, the read/write chip is encapsulated in a surface mount package. The design of the read/write chip is typically bound by the specifications that it is to dissipate the minimum amount of power possible and add the minimum amount of spurious electrical noise possible to the signal. The small signals extracted from the magnetic media by the read/write head can also be accompanied by spurious signals induced through capacitive or inductive coupling and wide band noise.

The quality of the signal provided to the read channel circuitry is important to the correspondence of the read output signal to the data read from the magnetic medium. It is important to preserve the quality of the signal output from the storage media system through the read channel in order to get a true digital representation of the data read from the storage medium. Any noise included within the signal output from the storage media system may effect the quality of the digital read output signal output from the read channel and result in errors in the transmission of the information read from the magnetic media.

Within magnetic storage systems such as hard disks multiple channels are generally included. In order to reduce the number of components and save space in a multi-channel system, the signals from the channels are multiplexed through a single pre-amplifier. The pre-amplifier is coupled to amplify the signal read by the magnetoresistive sensor from the magnetic medium in the selected channel. In such a system only a single channel is accessed at a given time. A schematic diagram of an amplifier circuit within a two channel magnetic storage system of the prior art is illustrated in FIG. 1.

In the amplifier circuit of FIG. 1 a first magnetoresistive sensor MRA, within a first channel, is coupled to the emitter of an npn transistor Q1A. A second magnetoresistive sensor MRB, within a second channel, is coupled to the emitter of an npn transistor Q1B. The collector of the transistor Q1A is coupled to the collector of the transistor Q1B and to the emitter of an npn transistor Q2. A voltage source VS1 is coupled to the base of the transistor Q2. The collector of the transistor Q2 is coupled to the first terminal of a resistor RI and to a negative input of a transconductance amplifier g1. A second terminal of the resistor R1 is coupled to the supply voltage Vcc. A reference voltage source Vref is coupled between the supply voltage Vcc and the positive input of the transconductance amplifier g1. The output of the transconductance amplifier g1 is coupled to a first terminal of a capacitor Cext and to an input of a buffer B1. A second terminal of the capacitor Cext is coupled to ground. The output of the buffer circuit B1 is coupled as an input to a switch 10. A first control output C1 of the switch 10 is coupled to the base of the transistor Q1A. A second control output C2 of the switch 10 is coupled to the base of the transistor Q1B. A control logic circuit 20 is coupled to control operation of the switch 10.

Depending on the current channel and corresponding magnetoresistive sensor being used within the magnetic media storage system, the control logic circuit 20 will control the switch 10 and couple the output of the buffer circuit B1 to the appropriate one of the control outputs C1 or C2. If the storage system is currently receiving signals from the magnetoresistive sensor MRA, the control logic circuit 20 controls the switch 10 and thereby couples the control output C1 to the output of the buffer circuit B1. This enables the transistor Q1A, coupling the magnetoresistive sensor MRA to the transistor Q2 and providing the bias current from the buffer circuit B1 to the magnetoresistive sensor MRA. Correspondingly, if the storage system is currently receiving signals from the magnetoresistive sensor MRB, the control logic circuit 20 controls the switch 10 and thereby couples the control output C2 to the output of the buffer circuit B1. This enables the transistor Q1B, coupling the magnetoresistive sensor MRB to the transistor Q2 and providing the bias current from the buffer circuit B1 to the magnetoresistive sensor MRB.

By using the switch 10 to switch between the magnetoresistive sensors MRA and MRB, the amplifier circuit of FIG. 1 is able to conserve power and space by requiring only a single bias current, provided from the output of the buffer circuit B1 to the appropriate one of the magnetoresistive sensors. However, in the storage systems of the prior art, the switch 10 is typically implemented by a saturated junction bipolar transistor. This switch 10 forms a favorable path to the magnetoresistive sensors MRA and MRB for noise and ripples coming through the supply voltage Vcc. This arrangement leads to a poor power supply rejection ratio and increased noise within the signal output from the pre-amplifier circuit.

What is needed is a switching apparatus for switching between channels in a multi-channel magnetic media storage system which does not introduce extraneous noise into the signal output from the pre-amplifier circuit.

SUMMARY OF THE INVENTION

A switching apparatus for switching between channels within a read/write pre-amplifier circuit in a multi-channel magnetic media storage system switches between the channels and couples an active magnetoresistive sensor to receive biasing current and to a pre-amplifier circuit. When a read operation is requested from a specific channel within the magnetic media storage system, a control signal line corresponding to an appropriate magnetoresistive sensor is activated. Each channel includes a first corresponding transistor which is enabled by an appropriate control signal line, allowing current to flow through the first transistor to enable a second corresponding transistor that is coupled to the magnetoresistive sensor. Once enabled the second transistor couples the magnetoresistive sensor to a pre-amplifier stage and to receive biasing current. The magnetoresistive sensor then transmits pulses, corresponding to the data being read from the magnetic medium, which are amplified by the pre-amplifier stage and provided as an output to a read channel. Multiple channels are supported, each including a magnetoresistive sensor and first and second corresponding transistors. A control logic circuit provides the control signal lines, one for each channel. A single compensation capacitor is included.

DETAILED DESCRIPTION OF THE PREFERRED EMBODIMENT

The switching apparatus of the present invention switches between channels in a multi-channel magnetic media storage system, coupling an active magnetoresistive sensor to receive biasing current and to a pre-amplifier circuit. When a read operation is requested from a specific location within the magnetic media storage system, an appropriate magnetoresistive sensor is activated. Each channel includes a first transistor corresponding to the appropriate magnetoresistive sensor which is enabled by a corresponding control signal line, causing current to flow through the first transistor and enabling a second transistor also corresponding to the appropriate magnetoresistive sensor. When enabled the second transistor couples the magnetoresistive sensor to a pre-amplifier stage and to receive biasing current. The pulses of the signals transmitted by the magnetoresistive sensor correspond to the data being read from the magnetic medium by the magnetoresistive sensor. These pulses are amplified by the pre-amplifier stage and are output to the read channel. The control signal lines, one for each channel, are provided from a control logic circuit.

Figure 2:
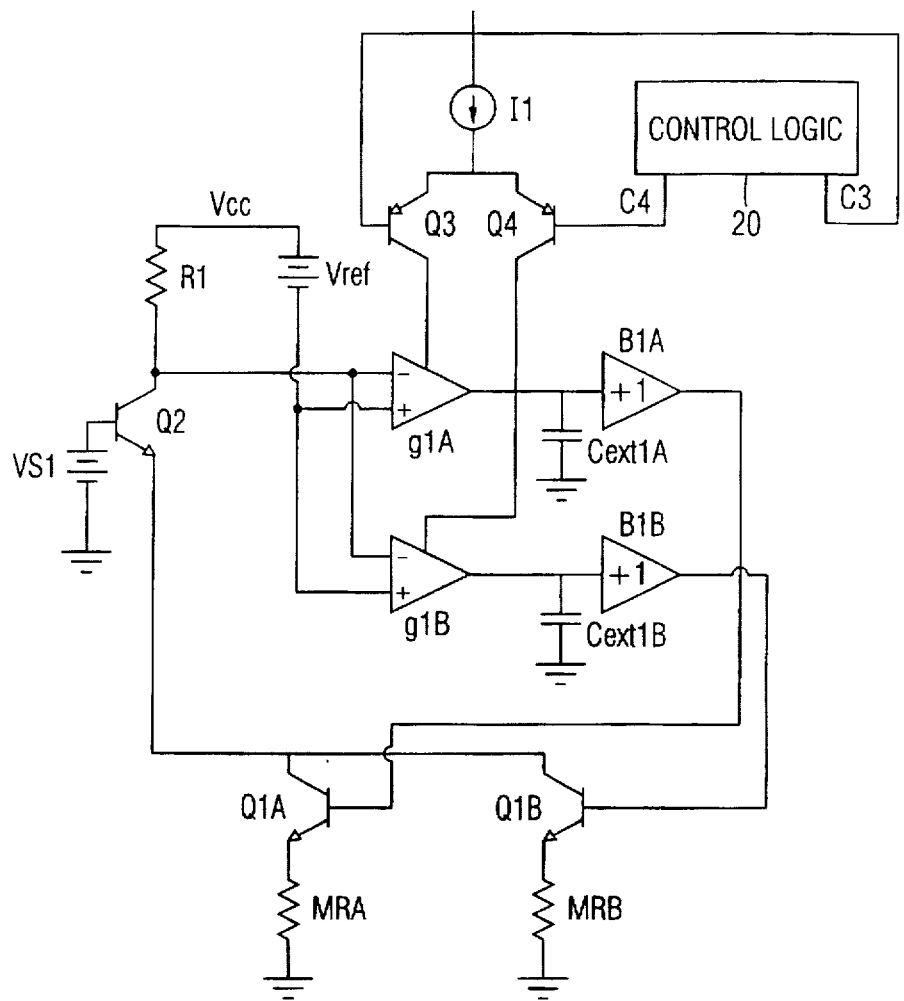
FIG. 2 illustrates a schematic diagram of an apparatus according to the present invention for switching between channels in a multi-channel magnetic media storage system.

A schematic diagram of a switching apparatus according to the present invention, for switching between channels in a multi-channel magnetic media storage system, is illustrated in FIG. 2. The first magnetoresistive sensor MRA is coupled to the emitter of the npn transistor Q1A. The second magnetoresistive sensor MRB is coupled to the emitter of the npn transistor Q1B. The collector of the transistor Q1A is coupled to the collector of the transistor Q1B and to the emitter of the npn transistor Q2. The voltage source VS1 is coupled to the base of the transistor Q2. The collector of the transistor Q2 is coupled to the first terminal of the resistor R1, to a negative input of the transconductance amplifier g1A and to the negative input of the transconductance amplifier g1B. The second terminal of the resistor R1 is coupled to the supply voltage Vcc. The reference voltage source Vref is coupled between the supply voltage Vcc and the positive input of the transconductance amplifiers g1A and g1B. Though the circuit of FIG. 2 only shows two channels, it will be apparent to one of ordinary skill in the art that more channels can be added and still accomplish the teachings of this invention.

The control logic circuit 20 provides the control output signals C3 and C4 for enabling the operation of the transconductance amplifiers g1A and g1B through the differential pair including the transistors Q3 and Q4. A current source I1 is coupled to the emitters of the pnp transistors Q3 and Q4. The control signal C3 from the control logic circuit 20 is coupled to the base of the transistor Q3. The control signal C4 from the control logic circuit 20 is coupled to the base of the transistor Q4. The collector of the transistor Q3 is coupled to a control input of the transconductance amplifier g1A. The collector of the transistor Q4 is coupled to a control input of the transconductance amplifier g1B. The output of the transconductance amplifier g1A is coupled to a first terminal of a capacitor Cext1A and to an input of a buffer B1A. A second terminal of the capacitor Cext1A is coupled to ground. The output of the buffer circuit B1A is coupled to the base of the transistor Q1A. The output of the transconductance amplifier g1B is coupled to a first terminal of a capacitor Cext1B and to an input of a buffer B1B. A second terminal of the capacitor Cext1B is coupled to ground. The output of the buffer circuit B1B is coupled to the base of the transistor Q1B.

When the control logic circuit 20 receives a signal that the storage system is executing a read operation from one of the magnetoresistive sensors MRA or MRB, the control signal line C3 or C4, corresponding to the selected magnetoresistive sensors MRA or MRB, is pulled to a logical low voltage level and the control signal line C4 or C3 corresponding to the nonselected magnetoresistive sensor MRA or MRB, is raised to a logical high voltage level. This enables the corresponding transistor, either the transistor Q3 or the transistor Q4, causing the current from the current source I1 to flow through the enabled transistor and turn on the appropriate transconductance amplifier g1A or g1B. The output of the enabled transconductance amplifier g1A or g1B builds a charge on the corresponding capacitor and provides a bias current to the corresponding magnetoresistive sensor through the corresponding transistor Q1A or Q1B, respectively. The selected magnetoresistive sensor MRA or MRB is also thereby coupled to the transistor Q2 through the low impedance path corresponding to the enabled transistor Q1A or Q1B, respectively.

As an illustrative example, if the storage system is executing a read operation which requires the operation of the magnetoresistive sensor MRA, the control signal line C3 is pulled to a logical low voltage level and the control signal line C4 is raised to a logical high voltage level. This causes the current from the current source I1 to flow through the transistor Q3 and enable the transconductance amplifier g1A. The transconductance amplifier g1A generates an output which builds a charge up on the capacitor Cext1A and provides a bias current to the magnetoresistive sensor MRA through the buffer circuit B1A and the transistor Q1A. The signals read from the magnetoresistive sensor MRA are then coupled to the pre-amplifier stage, amplified by the transistor Q2 and the resistor R1 and output to the read channel. Because no current is conducted through the transistor Q4, the transconductance amplifier g1B is not enabled. Correspondingly, the transistor Q1B is also not enabled and no bias current is provided to the magnetoresistive sensor MRB.

Figure 1:
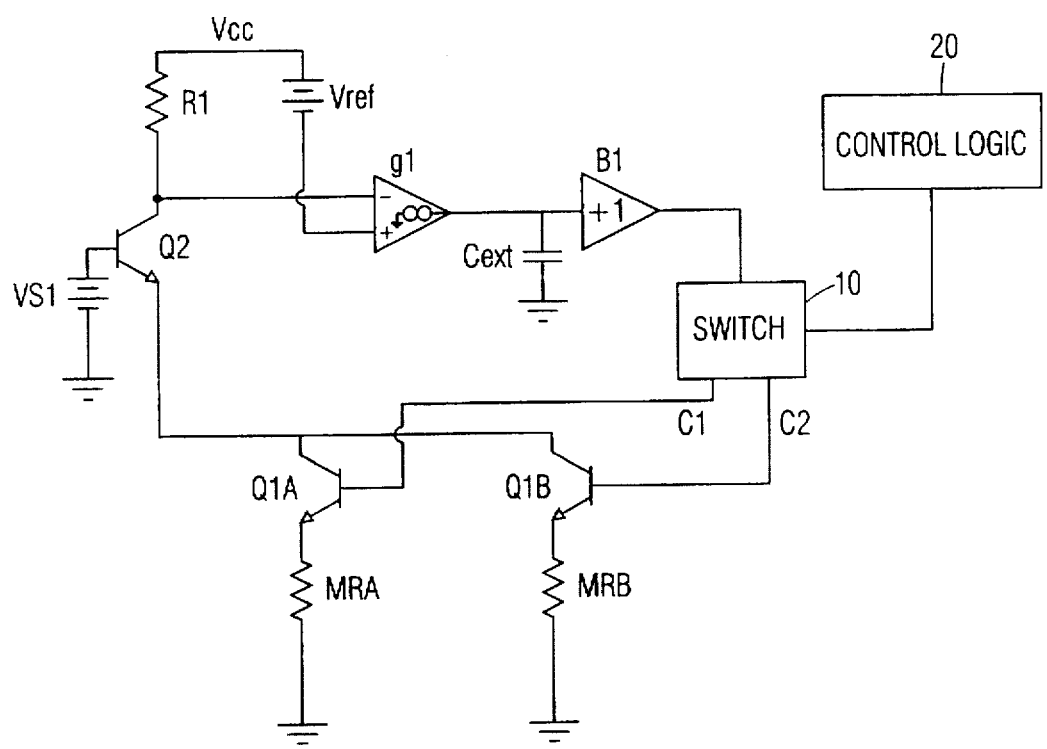
FIG. 1 illustrates a schematic diagram of an amplifier circuit within a two channel magnetic media storage system of the prior art.

In the embodiment illustrated in FIG. 2, a switch is implemented using the differential pair, including the transistors Q3 and Q4, to enable the appropriate one of the transconductance amplifiers g1A or g1B, depending on the current channel from which a signal is being received. This embodiment is advantageous over the switching circuits of the prior art, as illustrated in FIG. 1, because any noise caused by the switch will be divided by the gain of the feedback loop. This reduces the overall noise within the output signal of the amplifier circuit. However, the embodiment illustrated in FIG. 2 is not the most desirable configuration because it requires a separate external compensation capacitor Cext and accompanying circuitry for each channel, including a transconductance amplifier and buffer.

Figure 3:
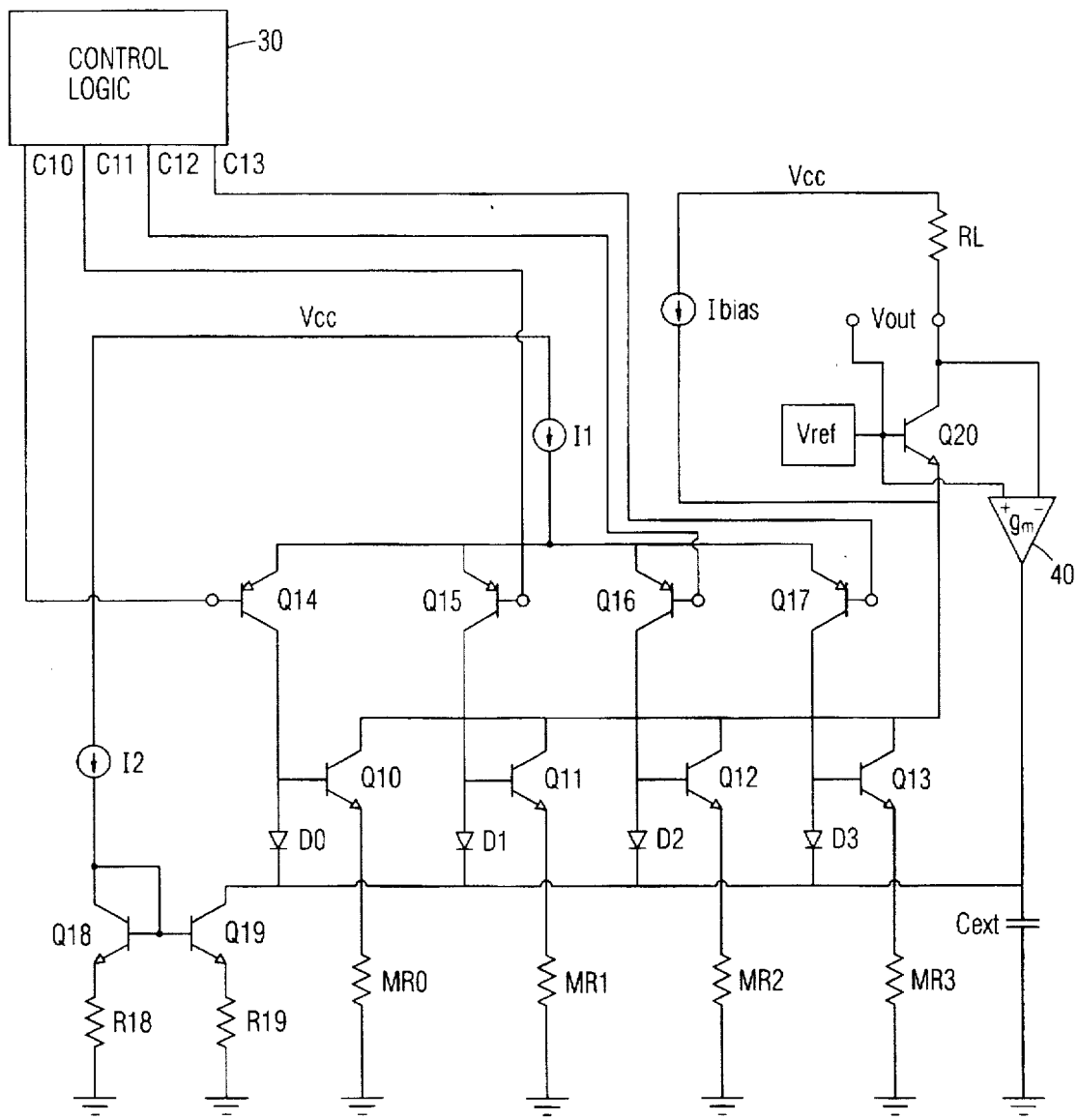
FIG. 3 illustrates a schematic diagram of the preferred embodiment of the switching apparatus of the present invention.

A schematic diagram of the preferred embodiment of the switching apparatus of the present invention is illustrated in FIG. 3. This switching apparatus switches between four channels, using the four magnetoresistive sensors MR0, MR1, MR2 and MR3, to read data stored on the magnetic medium within the storage system. The switching apparatus of FIG. 3 requires only a single external compensation capacitor Cext and accompanying circuitry.

The magnetoresistive sensor MR0 is coupled to the emitter of an npn transistor Q10. The magnetoresistive sensor MR1 is coupled to the emitter of an npn transistor Q11. The magnetoresistive sensor MR2 is coupled to the emitter of an npn transistor Q12. The magnetoresistive sensor MR3 is coupled to the emitter of an npn transistor Q13. The collector of the transistor Q10 is coupled to the collectors of the transistors Q11, Q12 and Q13, to a first terminal of a current source Ibias and to the emitter of an npn transistor Q20. A second terminal of the current source Ibias is coupled to the supply voltage Vcc. A reference voltage source Vref is coupled to the base of the transistor Q20 and to a positive input of a transconductive amplifier 40. The collector of the transistor Q20 is coupled to a negative input of the transconductive amplifier 40 and to a first terminal of a resistor RL. A second terminal of the resistor RL is coupled to the supply voltage source Vcc. The output Vout of the amplifier circuit of FIG. 3 is provided from a voltage difference taken between the reference voltage source Vref and the first terminal of the resistor RL.

An output of the transconductance amplifier 40 is coupled to a first terminal of the capacitor Cext, to the collector of an npn transistor Q19 and to the cathode of diodes D0, D1, D2 and D3. A second terminal of the capacitor Cext is coupled to ground. An anode of the diode D0 is coupled to the base of the transistor Q10 and to the collector of a pnp transistor Q14. An anode of the diode D1 is coupled to the base of the transistor Q11 and to the collector of a pnp transistor Q15. An anode of the diode D2 is coupled to the base of the transistor Q12 and to the collector of a pnp transistor Q16. An anode of the diode D3 is coupled to the base of the transistor Q13 and to the collector of a pnp transistor Q17. The emitters of the transistors Q14, Q15, Q16 and Q17 are all coupled to each other and to a first terminal of a current source I1. A second terminal of the current source I1 is coupled to the supply voltage Vcc.

The control logic circuit 30 provides the control signals C10, C11, C12 and C13 for selectively enabling the magnetoresistive sensors MR0, MR1, MR2 and MR3, respectively. The control signal C10 is coupled to the base of the transistor Q14. The control signal C11 is coupled to the base of the transistor Q15. The control signal C12 is coupled to the base of the transistor Q16. The control signal C13 is coupled to the base of the transistor Q17. A first terminal of a current source I2 is coupled to the supply voltage Vcc. A second terminal of the current source I2 is coupled to a collector of an npn transistor Q18. The base of the transistor Q18 is coupled to the base of the transistor Q19 to the collector of the transistor Q18 and to the second terminal of the current source I2. The emitter of the transistor Q18 is coupled to a first terminal of a resistor R18. A second terminal of the resistor R18 is coupled to ground. The emitter of the transistor Q19 is coupled to a first terminal of a resistor R19. A second terminal of the resistor R19 is coupled to ground.

The control logic circuit 30 selects the appropriate one of the control signals C10, C11, C12 or C13, depending on the active magnetoresistive sensor MR0, MR1, MR2 or MR3. The selected control signal C10, C11, C12 or C13 is pulled to a logical low voltage level, while the other control signals are raised to a logical high voltage level. Because of the common emitter, differential pair configuration of the transistors Q14, Q15, Q16 and Q17, the transistor with a logical low base voltage will be enabled, causing the current from the current source I1 to flow through it and thereby enable the corresponding transistor Q10, Q11 Q12 or Q13. The control logic circuit 30 will pull only one of the control signals C10, C11, C12 or C13 to a logical low voltage level at a given time. The transistor Q14, Q15, Q16 or Q17 controlled by the selected control signal C10, C11 C12 or C13 is enabled, causing the current from the current source I1 to flow through the enabled transistor, and thereby enabling the corresponding one of the transistors Q10, Q11, Q12 or Q13. The enabled transistor Q10, Q11, Q12 or Q13 couples the emitter of the transistor Q20 of the amplifier circuit to the appropriate one of the magnetoresistive sensors MR0, MR1, MR2 or MR3. Bias current is also provided to the active magnetoresistive sensor MR0, MR1, MR2 or MR3 from the bias current source Ibias through the enabled transistor Q10, Q11, Q12 or Q13. The amplifier circuit includes the transistor Q20 and the resistor RL which amplify the signals transmitted by the active magnetoresistive sensor MR0, MR1, MR2 and MR3.

The transistors Q18 and Q19 are coupled together in a current mirror configuration and together with the diodes D0, D1, D2 and D3 form a biasing circuit for properly biasing the enabled transistor Q10, Q11, Q12 or Q13. When the current from the current source I1 flows through the activated transistor Q14, Q15, Q16 or Q17, to enable the corresponding transistor Q10, Q11, Q12 or Q13, the corresponding diode D0, D1, D2 or D3 provides a discharge path for this current through the transistor Q19 and the resistor R19. When the appropriate diode D0, D1, D2 or D3 is providing this discharge path, it also has an appropriate voltage drop across it which serves to keep the voltage level of the base of the corresponding transistor Q10, Q11, Q12 or Q13 at the proper level to enable the transistor Q10, Q11, Q12 or Q13.

When a read operation is to be conducted from the magnetic medium corresponding to the magnetoresistive sensor MR0, the control logic circuit 30 pulls the control signal line C10 to a logical low voltage level and raises the control signal lines C11, C12 and C13 to a logical high voltage level. This enables the transistor Q14, causing the current from the current source I1 to flow through the transistor Q14 and turn on the transistor Q10. The bias current from the current source Ibias is provided to the magnetoresistive sensor MR0 through the transistor Q10. The pulses of the signal transmitted by the magnetoresistive sensor MR0 through the transistor Q10 are amplified by the pre-amplifier stage, including the transistor Q20 and the resistor RL, and output as the output voltage signal Vout.

When a read operation is to be conducted from the magnetic medium corresponding to the magnetoresistive sensor MR1, the control logic circuit 30 pulls the control signal line C11 to a logical low voltage level and raises the control signal lines C10, C12 and C13 to a logical high voltage level. This enables the transistor Q15, causing the current from the current source I1 to flow through the transistor Q15 and turn on the transistor Q11. The bias current from the current source Ibias is provided to the magnetoresistive sensor MR1 through the transistor Q11. The pulses of the signal transmitted by the magnetoresistive sensor MR1 through the transistor Q11 are amplified by the pre-amplifier stage, and output as the output voltage signal Vout.

When a read operation is to be conducted from the magnetic medium corresponding to the magnetoresistive sensor MR2, the control logic circuit 30 pulls the control signal line C12 to a logical low voltage level and raises the control signal lines C10, C11 and C13 to a logical high voltage level. This enables the transistor Q16, causing the current from the current source I1 to flow through the transistor Q16 and turn on the transistor Q12. The bias current from the current source Ibias is provided to the magnetoresistive sensor MR2 through the transistor Q12. The pulses of the signal transmitted by the magnetoresistive sensor MR2 through the transistor Q12 are amplified by the pre-amplifier stage, and output as the output voltage signal Vout.

When a read operation is to be conducted from the magnetic medium corresponding to the magnetoresistive sensor MR3, the control logic circuit 30 pulls the control signal line C13 to a logical low voltage level and raises the control signal lines C10, C11 and C12 to a logical high voltage level. This enables the transistor Q17, causing the current from the current source I1 to flow through the transistor Q17 and turn on the transistor Q13. The bias current from the current source Ibias is provided to the magnetoresistive sensor MR3 through the transistor Q13. The pulses of the signal transmitted by the magnetoresistive sensor MR3 through the transistor Q13 are amplified by the pre-amplifier stage, and output as the output voltage signal Vout.

The switching apparatus of the present invention switches between channels in a multi-channel magnetic media storage system without contributing extraneous noise to the output signal. While the preferred embodiment of the switching apparatus of the present invention switches between four channels, it should be apparent to those skilled in the art that a switching apparatus, following the teachings of the present invention, could be implemented to switch between any number of channels.

While the preferred embodiment of the present invention has been illustrated and described as an integrated circuit bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A switching apparatus for switching channels within a multi-channel storage system, having a plurality of channels, each corresponding to a predetermined number of storage locations and each including a magnetoresistive sensor, comprising:

a. a plurality of activation circuits, one for each channel, and each configured for activating and receiving signals generated by a corresponding magnetoresistive sensor;

b. a plurality of enabling circuits, one for each channel, for enabling a selective one of the activation circuits and thereby the corresponding magnetoresistive sensor; and c. a control circuit coupled to each of the enabling circuits for controlling operation of the enabling circuits.

2. The switching apparatus as claimed in claim 1 wherein the enabling circuits each comprise an enabling transistor, and an emitter of each of the enabling transistors are coupled together in a differential pair configuration supplied by a current source, so that a selective one of the enabling transistors is turned on by the control circuit, causing enabling current from the current source to flow through the selective one of the enabling transistors to the selective one of the activation circuits.

3. The switching apparatus as claimed in claim 2 further comprising a biasing current source coupled to each of the activation circuits for providing biasing current to the corresponding magnetoresistive sensor through the selective one of the activation circuits.

4. The switching apparatus as claimed in claim 3 further comprising an amplifier circuit coupled to each of the activation circuits for amplifying signals transmitted by the corresponding magnetoresistive sensor through the selective one of the activation circuits.

5. The switching apparatus as claimed in claim 4 further comprising a single compensation capacitor coupled to the activation circuits.

6. The switching apparatus as claimed in claim 5 wherein each of the activation circuits include an activation transistor enabled by the enabling current.

7. The switching apparatus as claimed in claim 6 wherein the control circuit provides a logical low voltage level signal to a base of the selective one of the enabling transistors and a logical high voltage level signal to a base of non-selected enabling transistors.

8. A switching circuit within a multi-channel storage system, including a plurality of magnetoresistive sensors each for writing data to and reading data from specific locations on a magnetic medium, comprising:

a. a plurality of channels, each configured for activating and receiving signals generated by a corresponding one of the magnetoresistive sensors and including:

i. an activation circuit configured for activating communication with the corresponding magnetoresistive sensor; and ii. an enabling circuit coupled to the activation circuit for enabling the activation circuit and thereby activating the corresponding magnetoresistive sensor; and b. a control circuit coupled to each of the channels for controlling operation of the channels.

9. The switching circuit as claimed in claim 8 wherein the control circuit ensures that only a single channel is operational at a time.

10. The switching circuit as claimed in claim 8 wherein the enabling circuit includes an enabling transistor having a base which is coupled to the control circuit.

11. The switching circuit as claimed in claim 10 wherein each enabling transistor further includes an emitter and further wherein all of the emitters of each of the enabling transistors are coupled together and to receive enabling current from a current source, whereby the control circuit activates a base of a selective one of the enabling transistors causing enabling current to flow through the enabling transistor to a corresponding activation circuit.

12. The switching circuit as claimed in claim 11 further comprising a single compensation capacitor coupled to the activation circuits of each channel.

13. The switching circuit as claimed in claim 12 wherein the base of the selective one of the enabling transistors is activated by the control circuit pulling the base to a logical low voltage level.

14. A preamplifier circuit for amplifying signals read by a plurality of magnetoresistive sensors within a multi-channel storage system having a plurality of channels, each corresponding to a predetermined number of storage locations comprising:
   a. a plurality of activation circuits, one for each channel, and each configured for activating and receiving signals generated by a corresponding magnetoresistive sensor;
   b. a plurality of enabling circuits, one for each channel, coupled to a corresponding activation circuit for enabling a selective one of the activation circuits and thereby a corresponding magnetoresistive sensor;
   c. a control circuit coupled to each of the enabling circuits for controlling the operation of the enabling circuits and activating one enabling circuit at a time corresponding to the selective one of the activation circuits;
   d. a biasing current source coupled to the activation circuits for providing biasing current to the corresponding magnetoresistive sensor through the selective one of the activation circuits; and
   e. an amplifier circuit coupled to each of the activation circuits for amplifying signals transmitted by the corresponding magnetoresistive sensor through the selective one of the activation circuits.

15. The preamplifier circuit as claimed in claim 14 further comprising a single compensation capacitor coupled to the activation circuits.

16. The preamplifier circuit as claimed in claim 15 wherein the enabling circuits each comprise an enabling transistor and all of the enabling transistors are coupled together in a differential pair configuration supplied by a current source, so that a selective one of the enabling transistors is turned on by the control circuit, causing enabling current from the current source to flow through it to the selective one of the activation circuits.

17. The preamplifier circuit as claimed in claim 16 wherein each of the activation circuits include an activation transistor turned on by the enabling current.

18. The preamplifier circuit as claimed in clam 17 wherein each enabling transistor includes a base coupled to the control circuit.

19. The preamplifier circuit as claimed in claim 18 wherein the selective one of the enabling transistors is turned on by the control circuit activating its base.

20. The preamplifier circuit as claimed in claim 19 wherein the bases of the enabling transistors are activated by pulling the selected base to a logical low voltage level.

* * * * *

UNITED STATES PATENT AND TRADEMARK OFFICE
CERTIFICATE OF CORRECTION

PATENT NO. : 5,760,635
DATED : June 2, 1998
INVENTOR(S) : Mehrdad Nayebi et al.

It is certified that error appears in the above-identified patent and that said Letters Patent is hereby corrected as shown below:

On the title page, item [75] Inventors: delete "Shuji" and insert --Shoji--

In Column 1, line 66, delete "RI" and insert --R1--.

In Column 4, line 30, delete "11" and insert --I1--.

In Column 4, line 46, delete "11" and insert --I1--.

In Column 5, line 62, insert a comma --,-- between Q19 and to.

Signed and Sealed this

Twentieth Day of October, 1998

Attest:

BRUCE LEHMAN

*Attesting Officer*    *Commissioner of Patents and Trademarks*